United States Patent [19]
Eschke

[11] 4,083,008
[45] Apr. 4, 1978

[54] METHOD AND CIRCUIT FOR GENERATION OF DIGITALLY FREQUENCY-SHIFTABLE ELECTRIC SIGNALS

[75] Inventor: Bernd Eschke, Detfurth, Germany

[73] Assignee: Blaupunkt-Werke GmbH, Hildesheim, Germany

[21] Appl. No.: 675,318

[22] Filed: Apr. 9, 1976

[30] Foreign Application Priority Data

Apr. 10, 1975 Germany ............................ 2515660
Apr. 14, 1975 Germany ............................ 2516242

[51] Int. Cl.² ........................................... H04B 1/04
[52] U.S. Cl. ............................... 325/163; 178/66 A; 340/171 R
[58] Field of Search ............... 325/163; 340/171 R; 178/66 R, 67, 66 A

[56] References Cited

U.S. PATENT DOCUMENTS

| 3,659,048 | 4/1972 | Zuerbus | 325/163 |
|---|---|---|---|
| 3,668,562 | 6/1972 | Fritkin | 325/163 |
| 3,793,589 | 2/1974 | Puckette | 325/137 |
| 3,801,911 | 4/1974 | Hörsten | 178/66 R |
| 3,801,912 | 4/1974 | Ragsdale | 325/163 |
| 3,991,389 | 11/1976 | Dwire | 178/66 R |

*Primary Examiner*—Robert L. Griffin
*Assistant Examiner*—Michael A. Masinick

*Attorney, Agent, or Firm*—Flynn & Frishauf

[57] ABSTRACT

A first counter operating as a frequency-shiftable frequency divider is caused to reset before its normal count recycle in one setting of a flip-flop to reduce the factor of frequency division in response to a keying signal. A second counter, operating on a digital input derived from the output of the frequency-shiftable divider sequences a logic network to produce a stepped wave output, with steps each of a duration of one or two count intervals sequentially connecting voltage at one of four several non-zero predetermined voltage levels in a predetermined sequence to the output. The stepped wave approximates a succession of half-wave sinusoids of the same polarity in which the bottom step of zero voltage is of zero width so that the last next lowest step of one sinusoid and the first of the next sinusoid join into a single two-period step. This wave is power-amplified and the polarity of alternate half sinusoids is reversed in the middle of the low two-period step, by switching in the output stage under control of the second counter. Strict symmetry of the resulting approximation of a sine wave is obtained with few different resistors defining one quarter of the wave shape. The circuit in the frequency divider that produces frequency changes in response to the keying signal is timed by a logic network to switch over only at alternate transitions of the output sinusoidal wave intervals.

22 Claims, 4 Drawing Figures

METHOD AND CIRCUIT FOR GENERATION OF DIGITALLY FREQUENCY-SHIFTABLE ELECTRIC SIGNALS

This invention concerns a method of generating frequency-modulated signals for transmission of coded information and a frequency-switchable wave generator therefor.

In the West German Federal Republic there has been in operation for some time a radio information system for vehicular traffic known by the acronym ARI (Autofahrer Rundfunk Information), a system in which news of interest to participants in vehicular traffic are transmitted by a VHF transmitter. The information thus broadcast relates to road conditions, traffic obstructions or bottlenecks and often also advice regarding possible detours and alternative routes. The information thus transmitted to the traffic participants is usually intended for the aggregate collectivity of users of major highways. Individually addressed information cannot practically be provided except in the case of so-called emergency calls. Furthermore, since all the drivers do not speak the local language or the major local language, language barriers provide a still further difficulty in the path of informing all the highway users, particularly at the times of maximum travel, when there is much international travel.

There is a further difficulty for the listeners that is not overcome by the ARI system, in that the observation of highway signs to find the way to the traveler's destination is frequently made more difficult by weather conditions and density of traffic.

A new system of guiding highway drivers to their destinations has accordingly been developed for major highways, particularly expressways and the like, to overcome the above-mentioned disadvantages of the ARI system. In this new system a vehicle driver, after naming his destination, is provided with important information such as directional instructions, road conditions, recommended speed, etc. automatically displayed visually.

It is an object of the present invention to provide methods and circuits for generation and inductive transmission of FM signals for (particularly, FS signals) a destination-differentiated guidance information system composed to a high degree of digital electronic components in which the fixed and mobile installations can be manufactured in a form utilizing integrated circuits.

SUMMARY OF THE INVENTION

Briefly, digital electrical signals are generated at at least two predetermined frequencies in a continuing sequence of single frequency pulse trains and utilized to produce by means of a counter a stepped wave form with steps of a duration of one or two count intervals, in a repetitive function generator circuit, is an approximation of a sequence of positive half waves of a sinusoidal curve in which the bottom step of zero voltage is reduced to zero width so that the next lowest step at the end of one half-sinusoid continues into the first step at that level of the next half-sinusoid. This stepped wave form is then supplied to an output transmission device in an output stage which reverses the polarity in the middle of the two-interval step between successive positive half sinusoids, thus closely approximating a sinusoidal wave with assurance of symmetry.

In a particularly preferred form of the output stage successive stepped waves that approximate positive half sinusoids are supplied to the center tap of the primary winding of an output transformer, preferably through an emitter-follower circuit, and the outer terminals of the primary winding are alternately switched to ground, while the ungrounded terminal is disconnected from the circuit, so that alternate half sinusoids have opposite polarities and the core of the output transformer is excited sinusoidally. Thus the output winding provides a sinusoidal output wave.

The transients of the stepped wave are filtered out by a simple low-pass filter, which is preferably a resistor and a capacitor across the primary winding of the output transformer.

Frequency shift is preferably accomplished simply by a control voltage applied to a digital logic circuit connected with a counter that determines the frequency division ratio of the digital frequency divider. The stepped wave is generated in response to frequency-divided signals by another logic circuit associated with a second counter to provide the proper sequence of voltage levels, the voltage levels being preferably derived from a resistor network fed by a common source of a predetermined d-c voltage through a common resistor which supplies current to an array of resistors which are capable of being switched into circuit in a sequence determined by the logic and the counter. In this manner the stepped wave can readily be made to approximate closely a sequence of half sinusoids of the same polarity, the approximation being either by the wave envelope or by the average voltage averaged over a suitable short interval, or in some similar fashion.

For convenience of selection of oscillator frequency, output frequencies, switchable frequency division ratios, and so on, it is convenient to interpose frequency doublers between the oscillator and the switchable frequency divider, or between the latter and the function generator circuit that generates the stepped wave, or in both places.

The alternate gating of the output stage is preferably controlled by a flip-flop that is stepped in synchronism with the more or less hypothetical zero voltage moment between successive positive sinusoids in the output of the function generator (i.e. the midpoint of the lower two-interval step). The square wave produced by the flip-flop is supplied preferably to power transistors of the AND-driver type and the input to each of these is furnished through a preliminary NAND-gate that permits a control signal to block the output stage when it is desired that the circuit should not produce any output signals in the secondary of the output transformer.

In an improved form of the invention, the interconnection of the frequency divider, function generator and output stage is such that the shift of the frequency division ratio and accordingly of the frequency of the stepped wave and of the sinusoidal output occurs only during the zero voltage interval between stepped waves and, preferably, only during alternate zero voltage intervals of the stepped wave when the transition direction is always in the same sense. This assures correct transmission of sophisticated information codes. The invention has the great advantage that with a network of logic gates and a minimum number of resistor combinations for the number of step levels, the output wave is caused to be substantially sinusoidal at the desired frequency from one moment of shift to the next moment of shift. Because the digital circuits are free of resonances in the operating frequency range, they are aperiodic in their make-up, so that there are no ringing effects and the like, even though the waves are highly sinusoidal and are virtually instantaneously switched in frequency. The forming of the stepped wave with an envelope conforming part of a sine wave is an operation that can readily be done with only ohmic resistances. As already mentioned, rapid frequency switching in response to an external keying signal is made possible by the method and circuit of the invention. Finally, the invention also provides the advantage that only a single analog amplifier component is needed in the entire circuit, the emitter-follower that amplifies the current and hence the power of the stepped wave supplied to the output coupling device.

Following an explanation of the type of system in which the method and circuit of the invention find particularly useful application, the invention will be described by way of illustrative example with reference to the accompanying drawings, in which.

The new destination-differentiated vehicular guidance system consists essentially of electronic equipment units in vehicles and electronic equipment units distributed at various points in the highway network. These are designed for inductive transmission between road equipment and vehicle equipment because the inductive communication system provides a minimum of interference between different stations on the same frequency even at fairly low separations.

Figure 1:
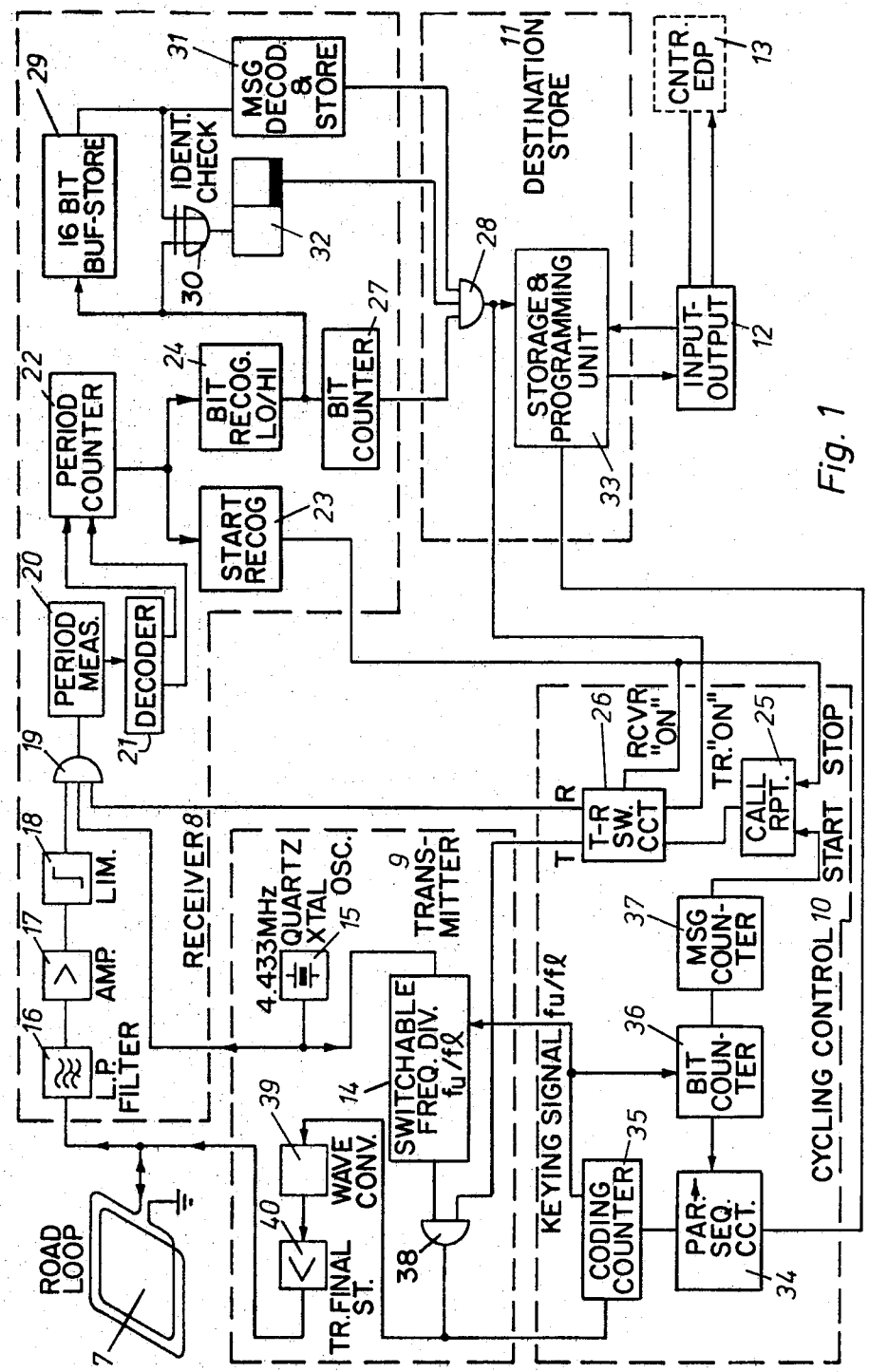
FIG. 1 is a block diagram of the fixed road equipment of a vehicular traffic communication system.
Figure 2:
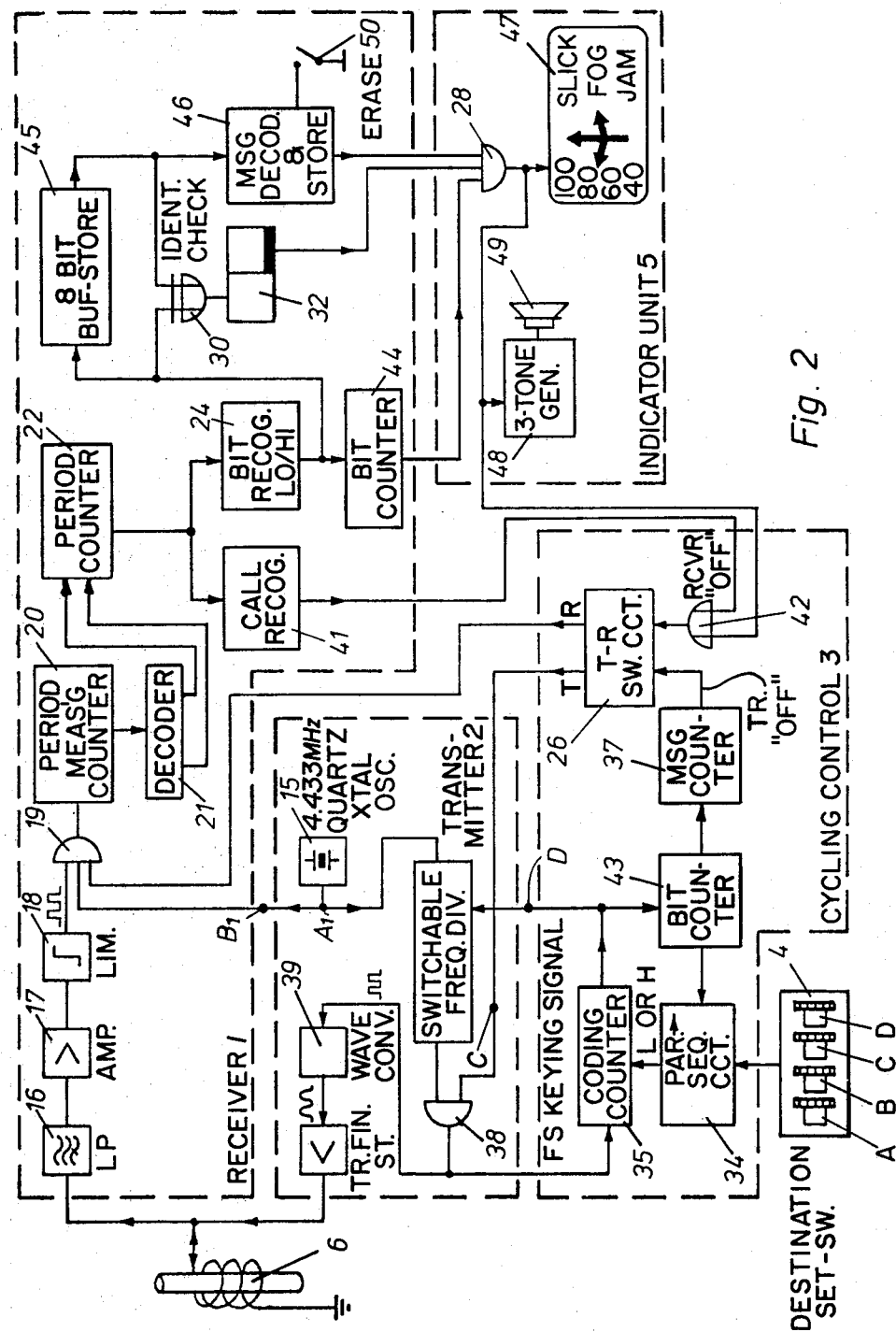
FIG. 2 is a block diagram of the vehicle-mounted equipment of a traffic communication system.

A vehicle equipment of the system, shown diagrammatically in FIG. 2, contains, as component units, a receiver 1, a transmitter 2, a cycling control or sequencing circuit 3, an addressing switch unit 4, an indicator unit 5 and a ferrite antenna 6. A road equipment for such a system, which would be placed at appropriate traffic decision points, such as expressway entrances and exits, interchanges and other highway intersections, contains, as diagrammatically shown in FIG. 1, as component units, a roadway buried loop 7, a receiver 8, a transmitter 9, a cycling control or sequencing switch circuit 10, an address store unit 11, and an input-output circuit 12 providing an interface with channels leading to a central traffic data processing system 13.

The exchange of information between the road equipment and the vehicle equipment passes back and forth between an induction loop 7 embedded in the road and a ferrite antenna 6 suitably located in the vehicle.

Input, output and storage of information are purely digital both in the road equipment and in the vehicle equipment. In order to transmit the information across the inductive link, binary information is converted into frequency shift modulation, either by going through a pulse length modulation stage or otherwise. Two frequencies are used that are obtained from a crystal-controlled oscillator 15, preferably operated at the usual "color carrier" frequency. A frequency-switchable frequency divider 14 does the frequency shifting. The input frequency of the frequency divider, which for example may be the color carrier frequency 4.433 MHz is divided by an overall factor that is sometimes 40 and sometimes 30, so that a lower frequency $f_1$ of 111 kHz and an upper frequency $f_u$ of 148 kHz are obtained.

All binary information appearing in the system is coded as follows with the use of the frequencies $f_1$ and $f_u$:

The condition "LOW" (L) is represented by a signal of seven periods of the frequency 148 kHz and 16 periods of the frequency 111 kHz. The condition "HIGH" (H) is represented by a signal consisting of 22 periods of the frequency 148 kHz and six periods of the frequency 111 kHz.

A so-called start sign is represented by a signal consisting of 30 periods of the frequency 148 kHz and six periods of the frequency 111 kHz.

In order to establish exchanges of information between the road equipment and vehicle equipments, the road equipment in its idle condition continuously sends out call signs that are identical with the start signs just described. If the vehicle equipped with the necessary vehicle communication equipment is located above an induction loop 7 in the road, the call signs are picked up by the vehicle equipment and recognized. The call signs serve to switch out the vehicle receiver 1 and simultaneously switch in the vehicle transmitter 2 which will then transmit to the road equipment the destination address that has been set into the address switch unit 4 of the vehicle. The address switch unit 4 is constituted as a four-pole coding switch working in hexadecimal code. The destination message is therefore 16 bits long. With this message length there are 65,536 destination possibilities.

The message begins with a start sign which switches in the receiver 8 and switches out the transmitter 9 of the road equipment. The 16-bit destination message is then transmitted. In actual practice it is repeated three times in succession, so that each pair of these successive destination messages can be checked for identity with each other.

As soon as the above operation has been performed, there automatically follows the switch-over of the vehicle equipment to receiving and of the road equipment to sending. The road equipment sends a start sign and an advice message that contains direction and speed recommendations and special notices, all contained in eight bits, likewise transmitted three times in succession. That completes the data transmission.

With the above-described mode of operation in mind, the block diagrams of the road and vehicle equipment can be readily understood with a description of the circuits in broad strokes only. Since the electronics of the road equipment and of the vehicle equipment are to a large extent the same, the same reference numerals are applied to identical components in the respective equipments.

In the road equipment shown in FIG. 1, a signal received in the inductive loop 7 proceeds over a low-pass filter 16, an amplifier 17 and a limiter 18, which puts the signal into rectangular form with TTL levels, to an AND-gate 19, the output of which is supplied to a counter 20 by which the frequencies $f_u$ and $f_l$ are detected by a period measurement made as follows. The resonance frequency of the oscillator 15, which is supplied to one input of the AND-gate 19, acts as the counting frequency. A decoder 21 of the counter 20 delivers a single pulse for each period detected, the pulse being delivered at one output if it is a period of the frequency $f_u$ and at the other output if it is a period of the frequency $f_l$. These pulses are counted for each frequency in the period counter 22, the output of which is supplied to a start sign recognition circuit 23 that recognizes a start sign as soon as it is present and, also to a bit recognition circuit 24 that distinguishes the "LOW" and "HIGH" information of the message bits.

As soon as the start sign recognition circuit 23 recognizes a start sign which a vehicle has transmitted, the circuit 23 interrupts the sequence of call signs transmitted by the road equipment by providing a signal to the call sign sequence circuit 25 and operates the send-receive change-over circuit 26 by providing the same signal to the "receiver on" input of the circuit 26. The circuits 25 and 26 form part of the cycle control component 10 of the road equipment. The receiver 8 of the road equipment now remains turned on long enough to receive the destination address of the vehicle three times.

The 16-bit destination address is, as already mentioned, sent three times by the vehicle. When it is received in the road equipment, the bit recognition circuit 24 provides a signal on the one hand through a bit counter 27 to an input of an AND-gate 28 and, on the other hand, to a shift register serving as a 16-bit buffer store 29 and to one input of an exclusive-OR-gate 30. The output of the 16-bit buffer store 29 is connected to a second input of the exclusive-OR-gate 30 and with a storage circuit 31. The output of the exclusive-OR-gate 30 is connected to a flip-flop 32. The outputs of the flip-flop 32 and of the storage circuit 31 are connected to further inputs of the AND-gate 28. As soon as the bit counter 27 has counted to 16 and two successive messages contained in the signal have been found identical, the message content of the storage circuit 31 is passed on and the destination address contained in the message is provided over the AND-gate 28 to a storage and programming unit 33.

The storage in programming unit 33 is so constituted that the arriving destination addresses are used to sort out the corresponding directional recommendations and the like. As soon as the destination address has been ascertained, the change-over circuit 26 is given an order by the output of AND-gate 28 received at one input of the change-over circuit 26 that changes over the road equipment from the receiving to the sending condition.

The directional recommendation related to the destination address received, together with supplemental information that may be available is provided by the storage and programming unit 33 to a parallel-series converter 34, which may be regarded as a demultiplexer, so that room will be made in the storage and programming unit 33 for new recommendations which may be received from the central traffic computer 13 over the input-output circuits 12. Telephone lines already present along expressways and other highways can be used as transmission lines connecting the input-output circuits 12 and the central traffic data processing system 13.

The advice message communicated to the parallel-series converter 34 is an 8-bit message and is composed as follows: two bits for a directional recommendation, and one additional bit. Out of the eight possibilities of these three bits are built up the codes for directional indication without supplementary indication and for directional indication with the supplementary indication "destination still ahead", "destination reached" or "wrong direction"; two bits for a recommended speed, two bits for a road condition announcement and one bit not yet assigned.

As already mentioned, in its idle condition, which is to say when no exchange of information with a vehicle is taking place, the road equipment continually sends call signs spaced by receptiion pauses during which a vehicle having received a call sign can answer. The transmission of the call signs as well as the sending of advice messages is controlled by the cycle control circuits 10. It consists essentially of the call sign sequence circuit 25, the change-over circuit 26, the parallel-sequential converter 34, a coding counter 35, a bit counter 36 and a message counter 37.

The call sign sequence circuit 25 makes sure that during the coding of a call sign the transmitter 9 of the road equipment remains turned on and that after the transmission the receiver 8 is switched on for a short time. The message counter 37 makes the necessary provisions for repeating three times the sending of a message consisting of a start sign and the information present in the parallel-sequential converter 34.

The eight bits of the advice message are supplied in parallel to the parallel-sequential converter 34 and are called out sequentially by the bit counter 36 so as to be supplied as "LOW" or "HIGH" conditions in an input of the coding counter 35. The latter undertakes the conversion of these conditions into the corresponding number of periods of the frequencies $f_u$ and $f_1$ as the counter advances at the frequency-divider output frequency. After having reached the necessary number of periods of the transmitted frequency $f_u$ for the "LOW" or "HIGH" condition as the case may be, the coding counter 35 supplies a switch-over signal to the frequency-switchable frequency divider 14 belonging to the transmitter 9 so that further transmission is at the frequency $f_1$, again for the correct number of periods, taking account of further frequency division occurring in the wave converter 39.

The frequency-shifted message pulses of the kind described in the description of the communication system accordingly appear at the output of the frequency-switchable frequency divider 14. These square waves are supplied to the input of an AND-gate 38, the second input of whih is connected to the change-over circuit 26. The second output of the change-over circuit 26 is connected to the input of an AND-gate 19.

The square waves are then converted into sinusoidal waves and amplified and this is symbolically represented in FIG. 1 by a wave converter 39 and an amplifier 40, the latter feeding the buried road loop 7, but as will be explained by FIG. 3, what is actually used in the present invention is a repetative function generator that does part of the conversion from square wave to sine wave, the conversion being actually completed in the final stage with an amplified form of the partly converted wave.

The block diagram of the vehicle equipment is shown in FIG. 2 and will be described insofar as it differs from the road equipment.

When the vehicle equipment receives a call sign from the road equipment, the signal picked up from the ferrite antenna 6 proceeds over components of the vehicle receiver 1 of the kind already described in connection with the road equipment to the period counter 22 and then into a call sign recognition circuit 41. From the latter a signal will be provided to one input of an OR-gate 42 the output of which is connected with the change-over circuit 26. The change-over circuit 26 produces a switching out of the receiver 1 and a simultaneous switching on of the transmitter 2.

As already explained, a destination address is set into the address switching unit 4, which provides 16 bits to the parallel-sequential converter 34. A destination message is then sent by the vehicle equipment in the same way that an advice message is sent by the road equipment. In this case the cycle control 3 of the vehicle equipment differs from the corresponding cycle control 10 of the road equipment only in that the bit counter 43 is designed for 16 bits and the output of the message counter 37 is connected directly with an input of the change-over circuit 26, the call sign sequence circuit 25 being in this case omitted. After the transmission of a destination message three times, the message counter 37 switches off the transmitter 2 through the change-over circuit 26, the receiver 1 being switched into the circuit at the same time for a period at least long enough for receiving three transmissions of a message, so that an advice message of the road equipment can be received.

The transmitter 2 of the vehicle equipment is identical with the transmitter 9 of the road equipment.

When the vehicle equipment receives an advice message from the road equipment, which message, as already explained consists of eight bits and is transmitted three times in succession, the message proceeds to the bit recognition circuit 24 where the information is reconstituted in the form of "LOW" and "HIGH" conditions. The output signal of the bit recognition circuit 24 is evaluated in the same manner as in the road equipment up to the AND-gate 28. In this case a bit counter 44 designed for only eight bits and a buffer store 45 likewise for eight bits as well as an 8-bit storage circuit 46 are provided.

As soon as two successive transmissions of an advice message are recognized as being identical, the message content is delivered over the output of an AND-gate 28 to an indicator device 47 for optical display. If the advice message, for example, has the directional advice "LEFT" and the additional warning "FOG", then in the display field 47 of the indicator the left-directed arrow and the legend "FOG" will be caused to light up by the decoding of the message in the device 47. The decoding operation can be carried on in the storage device 36, if desired, in which case the AND-gate 28 becomes an array of AND-gates for delivering the decoded signals to the respective symbols of the device 47 for their selective illumination.

A 3-tone generator 48 is also operated by the AND-gate 28 to indicate acoustically the reception of an advice message. After the completion of the reception of the advice message, the receiver 1 of the vehicle equipment is turned off by the change-over circuit 26 in response to a signal over a connection from the output of the AND-gate 28 passing through one of the inputs of the OR-gate 42.

As a rule the indications on the display field 47 remain until a new information exchange between the vehicle equipment and another road equipment takes place. The display can be extinguished earlier by hand, if desired, by operating a switch 50 that erases the message in the storage circuit 46.

Now that the block diagrams of the road and vehicle equipments have been explained, it is in order to describe an illustrative circuit embodying the invention, usable both in the transmitter 2 of the vehicle equipment and in the transmitter 9 of the road equipment, for generating and inductively transmitting FM signals, which may be more precisely described as frequency shift coded signals, or FS signals.

This illustrative embodiment of the new FS transmitter consists basically of the following component groups: Oscillator circuit 51, first frequency doubler 52, ratio-switchable frequency divider 53, second frequency doubler 54, function generator (wave converter) 55 and output stage (second wave converter, amplifier) 56.

The oscillator circuit 51 contains a quartz oscillator crystal 15 in series with a capacitor 58 and a trimming capacitor 57, the aforesaid combination of components being connected across the series combination of a first inverter 60, a capacitor 61 and a second inverter 63, the two inverters being respectively shunted by resistances 59 and 62. This oscillator circuit produces a basic stable signal at the resonant frequency of the crystal 15, for example 4.433 MHz. The signal of this frequency appears at the output $A_1$ of the oscillator circuit 51 and is provided through an inverter 64 to an oscillator frequency output $B_1$, where it may be made available to other equipment, for example to the receiving circuits, as already mentioned above. The oscillator output at point $A_1$ is also provided to a NAND-gate 65, to the other input of which a command signal, typically a transmit-receive (T-R) signal is provided from a terminal C.

The output of the NAND-gate 65 leads to the first frequency doubler circuit 52 and is there supplied both to the input of an inverter 66 and, through a first capacitor 67 to the input of a NOR-gate 68. The other terminal of the first capacitor 67 is connected to a first resistor 69 the other end of which is grounded. The output of the inverter 66 is connected to a second capacitor 70, the other terminal of which is connected to a second resistor 71, the other terminal of which is likewise grounded. The respective common connections of the first and second resistors with the first and second capacitors are respectively connected to two inputs of a NOR-gate 68, the output of which is the output of the frequency doubler circuit and delivers a digital (i.e. pulse-type) signal at a frequency of 8.866 MHz. This signal is the counting or stepping frequency for the counter 72 of the ratio-switchable frequency divider circuit 53 and is supplied to the counting input of the counter 72. The counter 72 in the illustrated case is of the type 7493, described in the Siemens-Datenbuch 1974/75, vol. 1, "Digitial Circuits MOS", page 178, and forms the heart of the frequency divider circuit 53. This counter is a 4-bit binary counter. The counting input here used is identified as B. Since the output $Q_A$ of this 4-bit counter is left unconnected rather than being connected to the counting input B, the 4-bit counter 72 counts only from zero to seven repeating these eight states continuously without requiring a reset command.

According to whether at the input terminal D an L or a H signal condition is present, the frequency divider circuit 53 divides the counting frequency of 8.866 MHz by eight or by six. This happens as follows: The outputs $Q_B$ and $Q_C$ of the 4-bit binary counter 72 are connected to the inputs of a NAND-gate 73; the output $Q_D$ is connected to the input of an inverter 74; the outputs of the NAND-gate 73 and of the inverter 74 are connected with the inputs of a second NAND-gate 75. The result of the logic network thus constituted is that the signal condition L appears at the output of the NAND-gate 75 for the decimal numbers 0 to 2 and the signal condition H appears there for the decimal numbers 3 to 7. As will presently be shown, when the 4-bit counter 72 is dividing by six, it is reset by the condition corresponding to the decimal number 6. In the mean-while there appears at the output of the NAND-gate 75 the signal condition L for the decimal numbers 0 to 2 and the signal condition H for the decimal numbers 3 to 5. With resetting at 6, the frequency of 1/6 of 8.866 MHz is present at the output of NAND-gate 75 and this frequency is then supplied to one input of the NAND-gate 76.

At the output $Q_D$ of the counter 72, which will be recognized as providing the signal condition L from 0 to 3 and the signal condition H from 4 to 7, the frequency of ⅛ of 8.866 MHz can be directly taken off, and this is supplied to an input of the NAND-gate 77.

The outputs $Q_C$ and $Q_D$ of the counter, are additionally connected to the inputs of a NAND-gate 78, the output of which goes to the input of an inverter 79, the output of which in turn supplies a signal to the first reset input $R_{01}$ of the 4-bit binary counter 72 which is not effective unless an H signal is at $R_{02}$.

Figure 3:
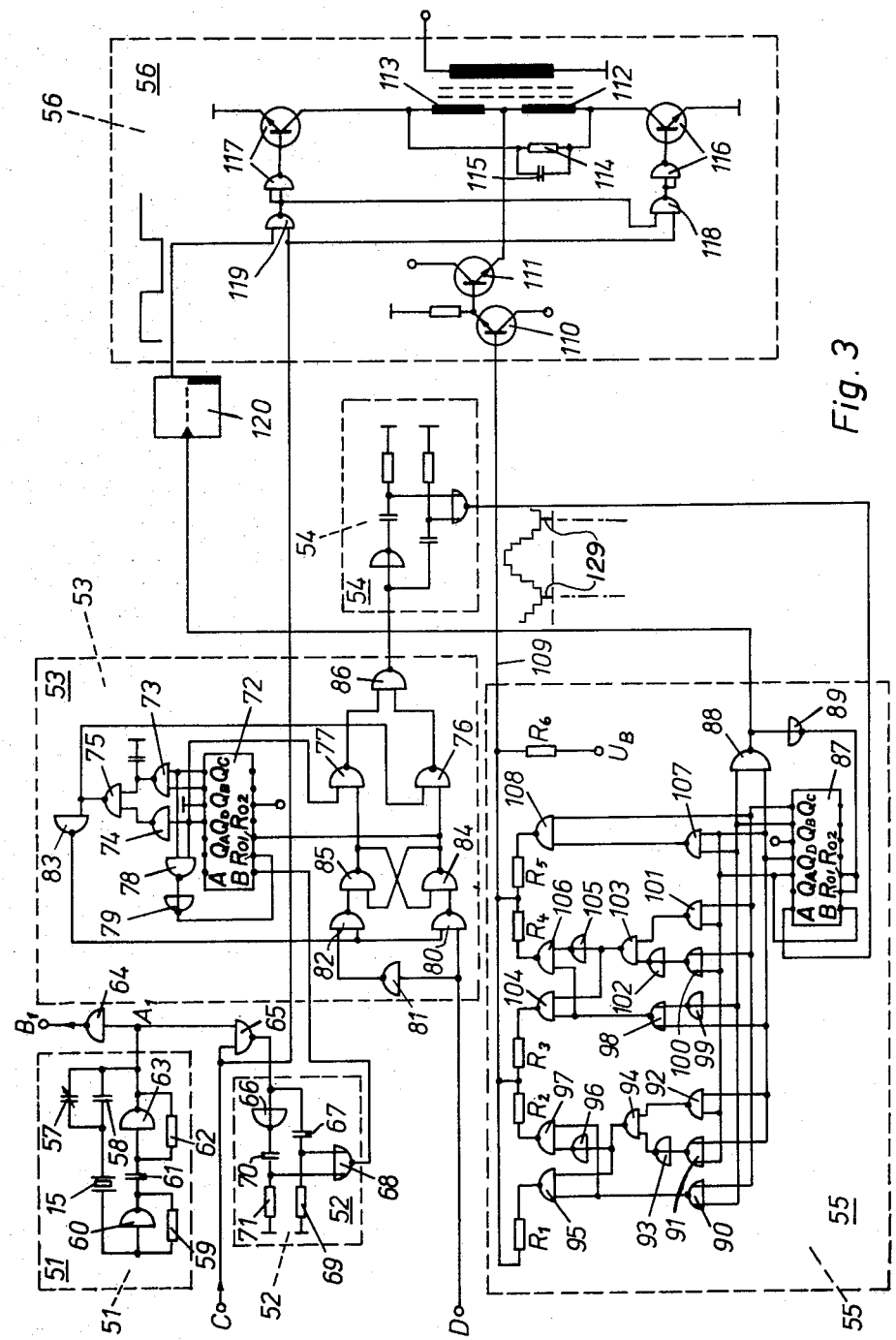
FIG. 3 is a circuit diagram of a frequency shift sine wave generator according to the present invention usable in the circuits of FIG. 1 and FIG. 2.

The input terminal D of the circuit of FIG. 3 is connected with one input of a NAND-gate 80 and also, through an inverter 81, with one input of a NAND-gate 82. The output of the NAND-gate 75 is connected through an inverter 83 with second inputs of both NAND-gates 80 and 82. The outputs of the NAND-gates 80 and 82 are connected respectively to opposite inputs of a bistable flip-flop composed of the cross-coupled NAND-gates 84 and 85. The output of the NAND-gate 84 is connected with one input of the NAND-gate 76, which as already mentioned, also receives an input from the output of the NAND-gate 75. The output of the NAND-gate 84 is also connected to the second reset input $R_{02}$ of the 4-bit binary counter 72. The output of the other NAND-gate 85 of the flip-flop circuit is connected to one input of the NAND-gate 77, which, as already mentioned, also receives an input from the divide-by-eight output $Q_D$ of the counter 72.

Before considering the operation of the frequency divider circuit 53, it should first be assumed that the signal condition L is present at the input terminal D of the circuit of FIG. 3 and hence also at one input of the NAND-gate 80. This results in a signal condition H at the output of the NAND-gate 80, regardless of the condition of the other input of that gate.

The signal condition L at the terminal D, on account of the presence in the circuit of the inverter 81 produces a signal condition H at the first input of the NAND-gate 82. Since at the output of the NAND-gate 75 there is present the signal condition L at count numbers 0 to 2 and the signal condition H for count numbers 3 to 7, the presence in the circuit of the inverter 83 produces the signal condition H from count 0 to count 2 and the signal condition L from count 3 to count 7, inclusive, at the second inputs of both NAND-gates 80 and 82.

Let it be assumed that the signal condition H is present at the output of the NAND-gate 85 of the flip-flop circuit, so that this condition is also present at the input of NAND-gate 77. The output of the second NAND-gate 84 of the flip-flop then presents the signal condition L, so that the NAND-gate 76 is blocked and provides the signal condition H at its output. At the same time the counting frequency divided by eight applied to the first input of the NAND-gate 77 is passed to the NAND-gate 86, the inputs of which are connected to the outputs of the NAND-gates 76 and 77, and this frequency also appears at the output of the NAND-gate 86, from which it is furnished to the input of the frequency doubler circuit 54, so that the frequency divider circuit 53 runs steadily at an input:output division ratio of 8:1.

The case may now be considered in which the signal condition at the terminal D of the circuit of FIG. 3, and hence likewise at one input of the NAND-gate 8 changes to the condition H. Since for the decimal numbers 0 to 2 the second input of the NAND-gate 80 also has the condition H, the signal condition L appears at the output of the gate, causing the bistable flip-flop to switch over, so that at the output of the NAND-gate 84 the signal condition H appears, while at the output of the NAND-gate 85 the signal condition L begins and blocks the NAND-gate 77.

Signal conditions H now appear both at the output of the NAND-gate 76 and at the second reset input $R_{02}$ of the counter, so that the signal present at the other input of the NAND-gate 76 passes through the NAND-gate 86 to the frequency doubler circuit 54. From now on, as a result of the logic network connecting the 4-bit counter 72 with the NAND-gate 78 and the inverter 79, the first reset input $R_{01}$ takes on the signal condition H precisely when both the counter output $Q_C$ and the counter output $O_D$ have the signal condition H, which occurs at the decimal count of 6. Since the reset inputs $R_{01}$ and $R_{02}$ in this particular counter are internally combined through the AND-gate, the 4-bit counter 72 will now be reset at the count of 6, so that the frequency of 8.866 MHZ divided by six is then provided to the second frequency doubler circuit 54.

If now the signal condition L reappears at the input terminal D, the division ratio of the frequency divider is switched over to 8 again.

The division ratio may be changed in the frequency divider 53 only when it is assured that the period length after the change-over (keying) has a duration determined by the division ratio. This is always the case in the zero position of the counter (actually for count steps 0, 1 and 2).

Since the circuit of the second frequency doubler 54 is identical with that of the first frequency doubler 52, it does not need to be further described here. Its output is connected to the counting input A of a second 4-bit counter 87 in the periodic function generator circuit 55, which may also be described as a digital wave form converter circuit.

The two frequency doubler circuits 52 and 54 are used because for the design of the particular illustrated circuit the fourth multiple of the resonant circuit of a "color carrier" quartz crystal is needed.

The 4-bit binary counter 87 is of the same type as the 4-bit binary counter 72, but because in this case the output $Q_A$ is connected to the second counting input B, the counter can count from zero to fifteen. The outputs $Q_B$ and $Q_D$ are connected with the inputs of a NAND-gate 88, of which the output is provided over an inverter 89 to the reset terminals $R_{01}$ and $R_{02}$. The result of this connection logic is to cause resetting of the 4-bit binary counter 87 by a pulse occurring at the appearance of the binary number HLHL, which as known corresponds to the decimal number ten, at the outputs of the counter so that the counter 87 counts 10 intervals 0 to 9, reverting to zero when an eleventh with designation "10" would otherwise appear.

The outputs $Q_A$, $Q_B$, $Q_C$ and $Q_D$ are connected to a logic network with components 90 to 108 that consists of NAND- and NOR-gates and are connected through this logic network to resistors $R_1$, $R_2$, $R_3$, $R_4$ and $R_5$ that are arranged to be energized through a common connection and through a resistor $R_6$ between that common connection and a source $U_B$ of d-c voltage. This common connection of the resistors $R_1$ to $R_5$ is also connected to a conductor 109 to the input of the output stage 56. The voltage source $U_B$ in the illustrated circuit has a potential of 5 volts. In this type of circuit the logic network 90 to 108 operates as a sequence switch that sequentially connects different resistors of the group $R_1$ to $R_5$ into the circuit.

The outputs for the lowest and highest counter condition are connected to the NOR- and NAND-gates leading to the resistor $R_1$, applying a reference voltage thereto. The counter outputs for the second lowest count and for the second highest count are connected to the NOR- and NAND-gates leading to the resistor $R_2$, and so on. The circuit thus operates as an up-and-down counter that counts from 0 to 4 and down again, with the counter position 4 having a double value, which is to say that the corresponding logic remains the same for two intervals of the counting period. The final 0 of one cycle and initial 0 of the next also form a double value period of constant output state.

Thus, for example if the resistor $R_1$ is connected in circuit, the voltage on the connection conductor 109, which may be designated $U_1/U_B$ is equal to $$R_1/(R_6 + R_1).$$

In the following count step period the resistor $R_2$ is connected in circuit (that is, returned to the other pole of the potential $U_B$, conventionally ground) and consequently $U_2/U_B$ is equal to $$R_2/(R_6 + R_2).$$

In the fifth count interval (count state four) $R_5$ is switched in circuit and the output voltage $U_5/U_B$ equals $$R_5/(R_6 + R_5).$$

In the sixth count interval $R_5$ is likewise connected in circuit, in the seventh interval $R_4$ and in the tenth $R_1$. $R_1$ is again connected in the first interval of the next cycle.

The resistors $R_1$ to $R_5$ and also $R_6$ are so dimensioned that the voltages $U_i$ for ($i = 1 \ldots 5$) increase from $U_1$ to $U_5$, so that as the counter proceeds the voltage $U_i$ first increases by steps and then decreases by steps until the minimum voltage $U_1$ is again reached and the cycle repeats. The result is a rising and falling stepped wave and the steps are of such magnitude that the stepped wave approximates a half period of a sine curve, preferably approximating it by having the envelope curve of the up-and-down stepped curve correspond to a half wave sinusoid of positive polarity, and the continuing stepped wave that appears at the output of the function generator 55 will have an envelope representing a succession of positive half wave sinusoids. In such an approximation, for reasons that will appear below, a dip of infinitesimal time to zero voltage, between the two count intervals in which $R_1$ is connected, is to be assumed. This is represented by the lines 129 on the wave form diagram for the line 109. Thus from a purely digital signal at the output of the second doubler circuit 54 a signal that is already similar to a sinusoidal signal is obtained at a frequency that is 1/10 of the input frequency provided by the doubler circuit 54.

Because of the use of purely ohmic resistors in the resistor network of the function generator 55 the circuit has an aperiodic behavior, which is to say that no ringing effect or the like occurs when keying the circuit from a frequency $f_u$ to a frequency $f_1$.

The output signal of the wave-converting function generator 55, supplied over the connection 109 to the final stage 56, is first amplified by two transistors 110 and 111 connected as emitter-followers, after which it is applied to the center tap of the primary winding of an output transformer. The primary winding consists of two winding halves 112 and 113. In this illustrative example each of the winding halves has 20 turns.

A parallel combination of a resistor 114 and a capacitor 115 is connected across the combination of the two winding halves 112 and 113, for filtering transients resulting from the voltage steps. The winding half 112 is connected to ground through the switching path of the output transistor of a power driver stage 116 and the winding half 113 is similarly connected to ground through the output transistor of a second power driver stage 117. The two power drivers 116 and 117 belong to a digital integrated circuit of type 49700 (described in the previously mentioned Siemens-Datenbuch 1974/75, vol. 1, Digital Circuits MOS, page 289) which contains two power drivers 116, 117 and two NAND-gates 118 and 119, the latter each having two inputs. The power drivers each have another NAND-gate connected as an inverter interposed in the control lead of the power transistor and are sometimes referred to as AND-power drivers.

The control signal present at the terminal C of the circuit of FIG. 3 is supplied to the input of each of the NAND-gates 118 and 119, this being the same control signal applied to the NAND-gate 65 interposed between the oscillator circuit 51 and the first doubler circuit 52, already described. The second input of the NAND-gate 119 is provided by the output signal of a flip-flop 120, the input of which is connected with the output of the NAND-gate 88 in the function generator circuit 55. As already explained, a trigger pulse signal with a frequency equal to 1/10 of the frequency supplied to the counting input A of the 4-bit binary counter 87 is present at the output of the NAND-gate 88. Furthermore, this pulse occurs between the two count intervals in which resistor $R_1$ is in circuit. During one period of the frequency of the output signal of the NAND-gate 88 and hence also of the input signal of the flip-flop 120 exactly one repetition period of the stepped wave provided over the connection 109 to the final stage 56 takes place, each period beginning and ending in the middle of the double interval during which $R_1$ is connected in circuit. Consequently two such periods of the stepped wave fall within one period of the rectangular wave signal provided at the ouput of the flip-flop 120.

The control signal applied to the control terminal C has the significance in this illustrative circuit that the signal condition H means "transmitter on" and the signal condition L means "transmitter off".

Assuming that the signal condition at the terminal C is H, which accordingly appears at one input of each of the NAND-gates 118 and 119, it will be seen that if the rectangular wave at the output of the flip-flop 120 at the same time has the signal condition H, there will result a signal condition L at the output of the NAND-gate 119 and likewise at the second input of the NAND-gate 118 as the result of the interconnection of these gates as shown in FIG. 3. In consequence the signal condition H will be produced at the output of the NAND-gate in the power driver 117 and the output transistor of that power driver will accordingly be in its conducting state. At the same time a signal condition H is produced at the output of the NAND-gate 118 and consequently a signal condition L at the output of the NAND-gate that is part of the power driver 116, so that the output transistor of that power driver is blocked. Therefore a period of the stepped wave, timed by the pulses from gate 88 and applied to the center tap of the transformer primary, which is to say to the common connection of the two winding halves 112 and 113, will produce a current that flows to ground through the winding half 113.

During the following period of the stepped voltage wave similarly timed the rectangular wave at the outputs of the flip-flop 120 has the signal condition L, which in a similar way will now turn on the output transistor belonging to the power driver 116 and turn off the output transistor belonging to the power driver 117. During this period of the stepped voltage a current flows to ground over the winding half 112.

By means of the winding halves 112 and 113, the control provided through the flip-flop 120 and the digital integrated circuit of the type 49700 converts the stepped voltage wave having an envelope curve corresponding to a succession of half-wave sinusoids into a voltage with a sinusoidal envelope curve. In other words, alternate half-wave sinusoids have their polarity reversed in the final stage processing which also provides amplification.

The polarity reversal occurs in the middle of the double interval of connection of resistor $R_1$ making a transition from a positive voltage level to a negative voltage level (and vice versa the next time). This explains why the assumed zero width interval of zero voltage at the end of each half sinusoid represented by the line 129 is taken into account in approximating a half sinusoid by the resistor values $R_1$-$R_5$.

The internal capacitance of the output transformer as well as the parallel combination of the resistor 114 and capacitor 115 produce a smoothing-out of the stepped voltage, so that a purely sinusoidal wave is transmitted through the transformer.

By the chosen form of control of the output transformer, utilizing the flip-flop 120 and the digital circuit component of type 49700, the result is also obtained that during a signal condition L at the control input C, that is during a "transmitter off" condition, both transistors in the respective power drivers 116 and 117 are blocked so that losses that would be caused by flow of current during an idle condition are avoided. In the final stage just described, that operates with alternately opposed strokes, similar to a class B push-pull amplifier, the circuit is made to operate with only a single analog amplifier component, in this case the emitter-follower transistor pair 110, 111 which may be provided as a single integrated unit.

It should be noted that it would have been conventional, to design the function generator 55 in a somewhat similar way to produce a stepped wave that approximates, either by its envelope or by the average voltage averaged over a suitably small interval, a sinusoidal wave rather than approximating a succession of half sinusoids of the same polarity. In that case it would not be necessary to provide the flip-flop 120 and the switching provided by the power drivers 116 and 117, and the final stage could be simply an amplifier with some inherent filtering to smooth the stepped wave into a sinusoidal wave, but in that case the number of advantages of the circuit of FIG. 3 would be lost. In the first place a larger number of steps (going both positive and negative) would be necessary to constitute a full sinusoidal wave with the same degree of approximation, the same resistors could not be used on the positive and negative halves of the wave to assure symmetry of wave form, and it would still be necessary to provide a switching operation to block the output stage during transmitter-off periods to prevent transmission of noise interfering with the receiver. The circuit 55 of the present invention is therefore preferable. As previously mentioned, before the detailed description of FIGS. 1, 2 and 3, it is desirable to time the effectiveness of a frequency shift imposed by the terminal D to the particular moment of the stepped wave produced by the function generator 55 determined by the gate 88, namely, the moment of polarity transition of the output of flipflop 120, and, preferably, to limit it to alternate operations of the gate 88 (alternate transitions of 120). This is because of the fact that the codes for the message information are bits represented by one condition consisting of seven periods of a first frequency and 16 periods of a second frequency and a second condition consisting of 22 periods of the first frequency and six periods of the second frequency, the first frequency being the higher in each case. Furthermore, a start signal must consist of 30 periods of the higher frequency and six periods of the lower. Consequently the switch-over must be after a full period of one frequency or the other and a switch-over on a half period is particularly to be avoided since it would appear to produce a 180° phase reversal and introduce unnecessary switching transients.

Figure 4:
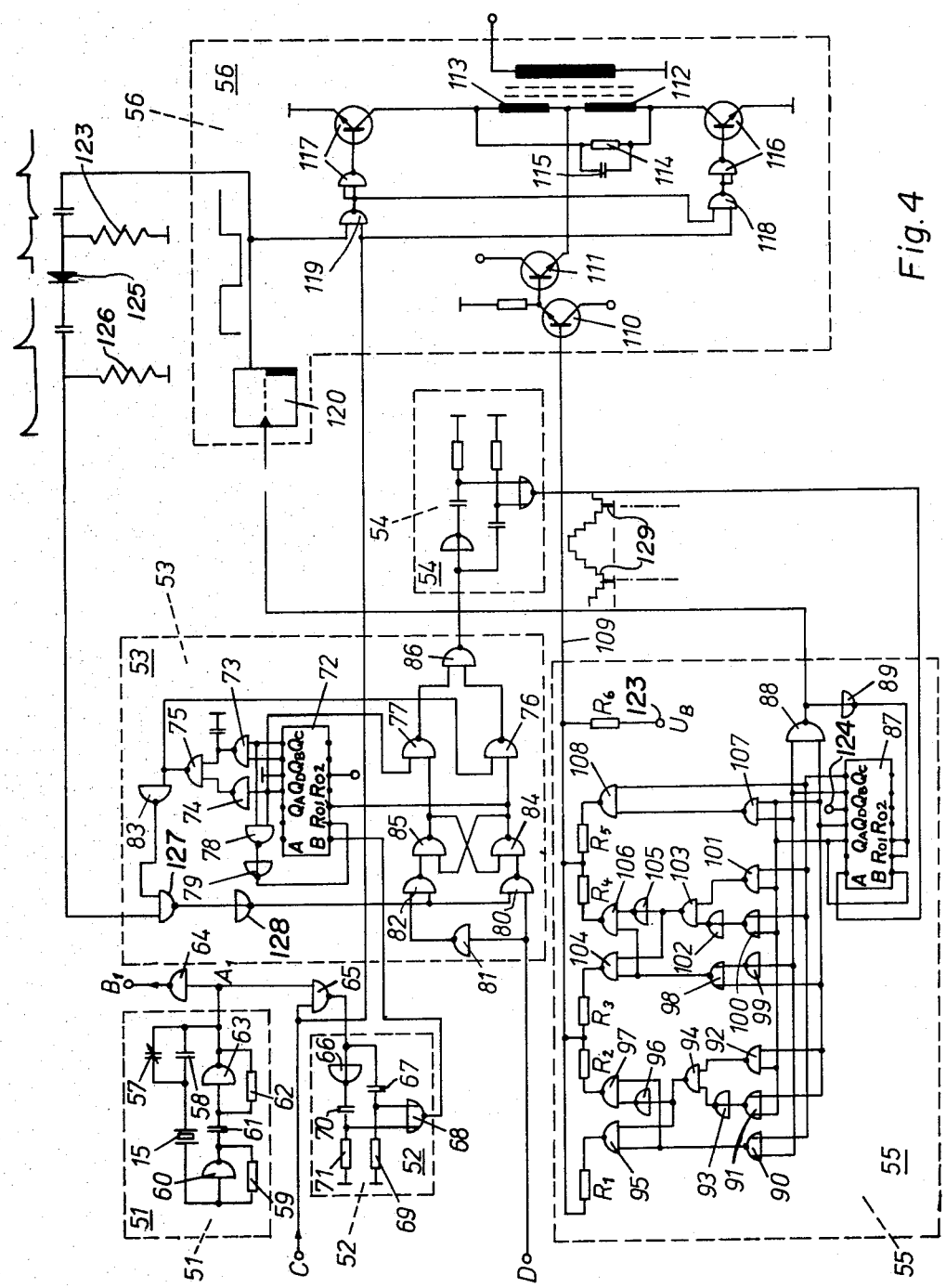
FIG. 4 is a modification of the circuit of FIG. 3.

As explained with reference to the frequency divider 53 shown in FIG. 3, the provision of the NAND-gates 80 and 82 ahead of the inputs to the flip-flop consisting of the two NAND-gates 84 and 85 assures that the flip-flop can be switched over only when an H signal condition appears on the inputs of the gates 80 and 82 which are connected with the output of the inverter 83. That is, in the circuit of FIG. 3 the flip-flop 84, 85 can be switched over only when the counter 72 is at 0, 1 or 2. The gates 80 and 82 can also be used to impose the condition above mentioned (alternate polarity transition of output of 120) regarding the relation of the moment of frequency switching to the phase of the output wave of the system. This is shown in FIG. 4, which shows the circuit of FIG. 3 modified by the addition of a small amount of logic for the purpose just mentioned. The output of the flip-flop 120 will be high during alternate halfwaves of the output wave, which is to say during alternate periods of the stepped wave defined by successive operations of the resetting gate 88 of the function generator 55. Consequently the rising edge of the high portion of the flip-flop output can be differentiated by the network 123, rectified by the diode 125 and sharpened by the network 126, and this output is furnished to a NAND-gate 127 interposed between the output of the inverter 83 and the gating inputs to the NAND-gates 80 and 82. The output of the NAND-gate 127 will accordingly have an L signal condition when an alternate reset interval of the counter 87 coincides with a count of 0, 1 or 2 of the counter 72. These three count states follow the resetting of the counter 72 and therefore have a predetermined close timing relation to alternate output periods of the frequency doubler 54. It may be necessary, according to the particular circuit design to lengthen the interval of the H condition produced through the diode 125, as can readily be done by omitting the network 126 or the insertion of a monostable multivibrator or some other similar delay circuit between the output of the network 126 and the NAND-gate 127, in order to make the H signal at the output of the gate 129 of a sufficient duration to be sure to catch a coincidence with the 0, 1 or 2 count of the counter 72. Alternately steps could be taken to assure that the counter 87 stays in step with the counter 72 and does not slip behind or ahead by one pulse of the output of the doubler 54. The output of the NAND-gate 127 provides an L signal at the desired interval for permitting switching of the multivibrator 84, 85, and of course an inverter 128 is necessary to provide an H signal condition during that interval at the gating inputs of the NAND-gates 80 and 82.

The amount of frequency multiplication and the frequency division ratios of the ratio-switchable frequency divider, as well as the frequency division produced in going from a digital pulse sequence to a sinusoidal wave, can readily be chosen so as to produce the desired output frequencies for the two frequencies of operation needed for the receiver, which may be 148 kHz upper frequency and 111 kHz lower frequency mentioned in connection with FIGS. 1 and 2.

Although the invention has been described with respect to a particular preferred embodiment, it will be recognized that modifications and variations may be made within the scope of the inventive concept. Thus, for example, although it is economical and convenient to make the logic circuits with NAND-gates, NOR-gates and inverters, it is also possible to use AND-gates, OR-gates and inverters. Likewise, in the case of the function generator 55, instead of using the combinational logic controlled by the counter to switch in different resistors as the second resistor of a voltage divider fed by a fixed d-c voltage, a set of d-c voltages may be kept continuously available and the combinational logic may be used to connect the various voltages in a predetermined sequence to an output terminal to provide the desired stepped wave. Furthermore, it is not necessary that the combinational logic of the function generator 55 should switch in only one resistor at a time in a resistor network, since with a somewhat different arrangement of the logic an equivalent result can be obtained by switching in different combinations of resistors, including sometimes only one and sometimes two or more, between connection 109 and the return conductor of the voltage $U_B$ which, as mentioned in connection with FIG. 3, would be connected to the current return bus terminal 124 of the counter 87.

I claim:

1. A frequency-switchable wave generator suitable for use in transmitting coded information by frequency shift including an oscillator, a frequency-switchable frequency divider for dividing the frequency of the output of the oscillator by a switchable ratio, a repetitive function generator circuit for converting the output of the frequency divider to a wave of a predetermined shape and an output stage responsive to the output of the repetitive function generator circuit in which the improvement is embodied that:

the repetitive function generator circuit (55) contains a counter (87) having its stepping input connected for response to a signal derived from the output of said frequency divider and connected by digital combinational logic means (90 to 108) to an array of resistors ($R_1$ to $R_5$) energized in parallel through an additional resistor ($R_6$) on which a d.c. voltage of predetermined value is applied, so as to produce at a first output (109), at the connection between said additional resistor ($R_6$) and said resistors energized in parallel ($R_1$ to $R_5$), a stepped periodic voltage wave of which the periodicity depends upon the stepping frequency of the counter (87), and which consists of an alternately rising and falling succession of intervals of a set of non-zero voltage levels of the same polarity of which the lowest and the highest are maintained for two-count intervals, approximating a succession of unipolar halves of a bipolar sinusoidal wave that passes through zero in the middle of the two-count interval of said lowest voltage level;

said ouput stage includes a coupling amplifier circuit (110,111) to the input of which said first output of said function generator circuit is connected and to the output of which is connected an output transformer having two mutually coupled energizing winding halves (112,113) across which the stepped periodic voltage wave produced by the repetitive function generator circuit (55) is caused to appear, and said output transformer is interconnected with low pass filtering means (114, 115) and with gating means (116,117) respectively connected to said winding halves (112,113) and with an alternating gating wave generator (120) responsive to said second output of said function generator so as to provide alternating polarity reversal in such a way that for the duration of a first period of the stepped periodic voltage wave a current is caused to flow through a first one of said winding halves (112) and for the duration of the next period of the stepped periodic voltage a current is caused to flow through the second of said winding halves (113), and so on in alternation.

2. A frequency-switchable wave generator as defined in claim 1, in which said low-pass filtering means are composed of a resistance (114) and a capacitance (115), both connected in parallel to a combination of both of said winding halves (112,113).

3. A frequency-switchable wave generator as defined in claim 1, in which said coupling amplifier circuit consists of a plurality of transistors (110,111) each of which is connected as an emitter follower.

4. A frequency-switchable wave generator as defined in claim 1, in which said frequency divider (53) includes a counter (72), a second combinational logic means (73 to 83, 86) and a bistable multivibrator (84, 85) so interconnected that a point (D) provided in the interconnections of said combinational logic means (73 to 83, 86) a binary signal may be applied having the effect of switching said frequency divider circuit (53) between a first and a second frequency division ratio.

5. A frequency-switchable wave generator as defined in claim 1, in which said second output of said function generator circuit is also connected internally of said function generator circuit so as to provide a resetting pulse for said counter (87) of said function generator circuit (55).

6. A frequency-switchable wave generator as defined in claim 1, in which second gating means (118,119) are interposed between said gating wave generator (120) and said first gating means for enabling and disabling said output stage (56) in response to a command signal.

7. A frequency-switchable wave generator as defined in claim 1, in which said gating means (116,117) include power transistors respectively connected to each of said winding halves and respectively controlled through NAND-gates connected as signal inverters.

8. A frequency-switchable wave generator as defined in claim 7, in which said alternate gating wave generator includes a bistable multivibrator (120) having its input connected to said second output of said function generator circuit and its output connected so as to drive said power transistors respectively into opposite states.

9. A frequency-switchable wave generator as defined in claim 1, in which a frequency doubler (52) is interposed between said oscillator circuit (51) and said frequency divider (53).

10. A frequency-switchable wave generator as defined in claim 9, in which a second frequency doubler (54) is interposed between said frequency divider (53) and said function generator circuit (55).

11. A frequency-switchable wave generator as defined in claim 9, in which the input of said frequency doubler (52) includes an inverter (66) having its input connected to the input of said frequency doubler (52) and to a first capacitor (67) and its output connected to a second capacitor (70) and also contains a NOR-gate (68) having two inputs, each connected through one of said capacitors to a terminal of said inverter (66) and likewise each connected individually through a resistance (69, 71) to ground, the output of said NOR-gate (68) constituting the output of sad frequency doubler (52).

12. A frequency-switchable wave generator as defined in claim 1, in which means (123,125,126) are provided for interconnecting said gating wave generator (120) with said frequency divider that said frequency divider is switchable only during alternate transitions of the output of said gating wave generator.

13. A frequency-switchable wave generator as defined in claim 12, in which the output of said coupling amplifier circuit of said output stage is supplied to a common connection of said primary winding halves, and in which the other two terminals of said primary winding halves are connected through said gating means (116,117) for grounding the respective winding halves in alternation.

14. A frequency-switchable wave generator as defined in claim 13, in which said function generator circuit includes a counter (87) having its stepping input connected for response to a signal derived from the output of said frequency divider and connected by digital combinational logic means (90 to 108) to an array of resistors ($R_1$ to $R_5$) energized in parallel through an additional resistor ($R_6$) on which a d.c. voltage of predetermined value is applied, so as to produce at a first output of the wave-shaping stage at the connection between said additional resistor ($R_6$) and said resistors energized in parallel ($R_1$ to $R_5$) a stepped periodic voltage which approximates a succession of sinusoidal half-waves of the same polarity and of which the periodicity depends upon the stepping frequency of the counter (87), and said output stage includes a coupling amplifier circuit to the input of which said first output of the repetitive function generator circuit is connected and to the output of which is connected an output transmission device (112,113) interconnected with control means (116,117) and low-pass filter means (114,115) in such a way as to enable said output transmission device to generate a sinusoidal electrical wave.

15. A frequency-switchable wave generator as defined in claim 13, in which said low-pass filtering means are composed of a resistance (114) and a capacitance (115), both connected in parallel to a series combination of both of said winding halves (112,113).

16. A frequency-switchable wave generator as defined in claim 13, in which said gating means (116,117) include power transistors respectively connected to each of said winding halves and respectively controlled through NAND-gates connected as signal inverters.

17. A frequency-switchable wave generator as defined in claim 16, in which said alternate gating wave generator includes a bistable multivibrator (120) having its input connected to said second output of said function generator circuit and its output connected so as to drive said power transistors respectively into opposite states through a pair of NAND-gates (118,119) arranged to permit operation of the output stage to be enabled or blocked by a changeover control signal applied to an input of each of said NAND-gates.

18. A method of generating frequency-shift code signals for a system for automatic exchange of coded information, with an oscillator shiftable between predetermined frequencies, a repetitive function generator circuit and an output stage, comprising the steps of:
generating electrical digital signals by means of said oscillator at at least two predetermined frequencies in a sequence of single-frequency emissions;
producing, by using current from a direct current source, in said function generator circuit, in response to said digital signals, a repeated stepped wave formed of a succession of intervals of a constant non-zero voltage level of the same polarity of which the highest and the lowest levels are maintained for twice as long as each of the others and the different voltage levels succeed each other in steps alternately rising from the lowest to the highest and descending from the highest to the lowest;
reversing the polarity of the wave produced in the preceding step at the middle of each interval of said lowest voltage level to produce an output wave;
filtering the wave produced in the preceding step to smooth out the stepped structure, and
shifting the frequency at which said electrical digital-signals are generated from time to time but only at times coinciding with a polarity reversal which reverses the polarity of said output wave in a predetermined sense.

19. A method as defined in claim 18, in which said voltage levels are so chosen that said output wave is a signal of sinusoidal form.

20. A method as defined in claim 18, in which is included the additional step of controlling the time during which said output stage provides an output signal by means of an external command signal applied to the output stage.

21. A method as defined in claim 18, in which the step of generating said digital signals consists of obtaining a basic timing frequency from said oscillator and subjecting it to frequency division, using a wave of the frequency thus divided in the second step set forth in claim 18, and performing the frequency-shifting step by switching the ratio of frequency division to which the basic timing frequency is subjected.

22. A method a defined in claim 21, in which the step of switching the frequency division ratio is an operation of switching between two division ratios and is controlled by a control signal from a source external to the oscillator, frequency divider and repetitive function generator circuits, resulting in the provision to the repetitive function generator circuit of a digital signal that is keyed between an upper and a lower frequency.

* * * * *